(12) United States Patent
Kutzschebauch et al.

(10) Patent No.: US 6,557,159 B1
(45) Date of Patent: Apr. 29, 2003

(54) METHOD FOR PRESERVING REGULARITY DURING LOGIC SYNTHESIS

(75) Inventors: Thomas Kutzschebauch, Yorktown Heights, NY (US); Leon Stok, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/578,090

(22) Filed: May 24, 2000

(51) Int. Cl.[7] ............................................. G06F 17/50
(52) U.S. Cl. ............................................. 716/18; 716/8
(58) Field of Search ...................... 716/1–18

(56) References Cited

U.S. PATENT DOCUMENTS

| | | | | |
|---|---|---|---|---|
| 4,630,219 A | * | 12/1986 | DiGiacomo et al. | ........... 716/9 |
| 4,703,435 A | * | 10/1987 | Darringer et al. | ............. 716/18 |
| 5,359,538 A | | 10/1994 | Hui et al. | ....................... 716/9 |
| 5,506,788 A | * | 4/1996 | Cheng et al. | ................. 716/10 |
| 5,508,937 A | | 4/1996 | Abato et al. | .................... 716/6 |
| 5,537,330 A | | 7/1996 | Damiano et al. | ............. 716/18 |
| 5,737,237 A | * | 4/1998 | Tanaka et al. | .................... 716/9 |
| 5,838,583 A | | 11/1998 | Varadarajan et al. | ............ 716/9 |
| 6,148,433 A | * | 11/2000 | Chowdhary et al. | ............ 716/1 |

OTHER PUBLICATIONS

T. Kutzschebauch, "Logic Optimization Using Regularity Extraction", In Proceedings of the 35th Design Automation Conference, pp. 336–341, Jun. 1998.

R.X.T. Nijssen and J.A.G. Jess, "Two–Dimensional Datapath Regularity Extraction", In Proceedings of the 5th ACM/IEEE Physical Design Workshop, Reston, Virginia, 1996.

* cited by examiner

*Primary Examiner*—Vuthe Siek
*Assistant Examiner*—James Sun Lin
(74) *Attorney, Agent, or Firm*—F. Chau & Associates, LLP

(57) ABSTRACT

The present invention concerns a method for maintaining regularity in a netlist during logic synthesis. The method determines a global regularity for the netlist. The method determines a group of elements in the netlist having similar regularity signatures. Further, the method applies a transform to the group of elements.

17 Claims, 4 Drawing Sheets

METHOD FOR PRESERVING REGULARITY DURING LOGIC SYNTHESIS

BACKGROUND OF INVENTION

1. Field of the Invention

This invention relates to methods for automated design of electronic devices, and more particularly, to methods for maintaining regularity in electronic circuit designs while increasing synthesis speed and quality.

2. Background of Related Art

The increasing complexity of microelectronic designs and the continuous development of fabrication processes, yielding smaller layouts, presents new challenges to existing design automation tools. It is widely acknowledged that future electronic design automation methodologies must be able to handle the challenges and opportunities inherent in very large designs. This particularly applies to the field of logic synthesis, as existing design sizes already present a considerable challenge to current synthesis tools.

Future synthesis tools are expected to handle millions of gates in a reasonable amount of time. However, traditional logic synthesis is not able to satisfy these increasing demands. Due to the amount of available topological and functional transformations and their non-incremental nature, it is generally difficult and computationally expensive to select an optimal subset of transformations and their respective sequence. Therefore, current synthesis methodologies rely mainly on the concept of trial and error, applying sequences of transformations until a satisfactory arrangement is found. This process, however, produces a tradeoff between efficiency and quality and generally, does not yield optimal results. In addition, results vary depending on the actual designs, hence the overall optimization is left to the experienced designer.

In logic synthesis of large designs, efficiency in determining places to apply transformations to the design is a desired goal. When a transform succeeds at a certain place, it would be desirable to apply it quickly at other places in the design with the same characteristics.

Another important challenge of logic synthesis is the preservation of regular design structures during the optimization process. Maintaining regularity has significant advantages to the physical design stages. In particular, placing regular structures in rows and columns, yields a much denser layout, decreasing wire length and delay, and simplifying the overall placement task. In addition, the layout of a regular design is more predictable at an early design stage. The extraction of regularity and its usage has been exploited and used extensively to obtain high-density layouts in placement. Special placement techniques, such as datapath placement, have been developed to take advantage of regular structures.

While it is widely acknowledged that generic logic synthesis destroys a substantial amount of structural regularity, particularly during logic minimization and technology mapping, previously published approaches focus on the extraction of regularity. The problem of maintaining regularity throughout the design flow has rarely been addressed, and to date, no known solutions have been presented. A commonly used concept to avoid destruction of regularity is to skip logic minimization and map the technology by manual assignment of library cells. This process not only demands a substantial amount of manual work, it is also unable to benefit from potential improvements in logic minimization algorithms and is therefore generally undesirable.

In conclusion, a need exists for methods to efficiently synthesize logic netlists while maintaining regularity and achieving high quality designs.

SUMMARY OF THE INVENTION

A method for maintaining regularity in a netlist according to the present invention determines a structural regularity. The method determines a group of structures having similar regularity signatures. In one embodiment of the present invention, a method for maintaining regularity in a netlist is described. The method determines structural regularity. In one step, the method applies transformations to all elements of a stage within a regular group. In another step, the method determines regularity signatures for all elements of that stage. The method also compares the regularity signatures of all elements of the stage to determine whether the regularity signatures are identical. Further, the method, upon determining that the regularity signatures are different, removes any changes applied by the transformation to the netlist.

In another embodiment of the invention, a method to speed up the logic synthesis of a netlist is described. The method determines regularity signatures for elements of a netlist. Furthermore, the method identifies a beneficial transformation to a place in the network. In another step, the method re-applies the same transformation to all others places which have an equivalent regularity signature.

According to yet another embodiment of the present invention, a method for maintaining regularity in a netlist during logic synthesis is disclosed. The method determines a global regularity for the netlist, determines a group of elements in the netlist having similar regularity signatures, and applies a transform to the group of elements.

The method further, determines a regularity signature for each element within the group, and determines whether the regularity signatures for each element are identical, if the signatures are different the method removes the changes to the netlist made by the transform.

The method is performed for each stage in the order of dataflow through the netlist.

The global regularity is determined by the method in accordance with the following relationship:

$$RI_p = \frac{1}{Aavg \cdot (n_{grp} + n_{nr})} \cdot \left( \sum_{i=1}^{n_{nr}} A_{nr_i} + \sum_{i=1}^{n_{grp}} \left( A_{grp_j} \cdot \frac{2 \cdot \sqrt{A_{grp_j}}}{h_i + w_i} \right) \right) - 1$$

where: $RI_p$ is the physical regularity index measuring the amount of global regularity that effectively improves area and delay cost functions in the final physical layout; $n_{grp}$ is the number of regular groups; $n_{nr}$ is the number of gates which are not assigned to a regular group; h is the group height; w is the group width; Aavg is the average physical area of a gate in the design; $Anr_i$ is the area of gate i not assigned to a regular group; and $Agrp_j$ is the area of the regular group, j.

The method classifies each element into a signature class according to regularity signatures. The method also identifies a place in the netlist to improve, identifies a class method when an improvement can be made, applies the class method to each class member, determines whether the class method is successful, and upon determining that the class method is unsuccessful, removes the changes made by the class method. The method also updates regularity signatures and classes.

According to the current embodiment, the method identifies the class method by applying a plurality of transforms to the place. The method determines which transform achieves a defined solution, and defines the successful transform as the class method.

The method determines success according to whether the regularity signatures for each class member are identical after the application of the class method.

An element, according to the method, includes a net, a gate, or both a net and a gate. The regularity signature includes a logic signature, a time signature, an area signature or a power signature. The regularity signature includes an adaptive signature for controlling changes in the netlist made by the transform. According to the method, the transform applies an action.

In yet another embodiment of the present invention, a method for maintaining regularity in a netlist during logic synthesis determines a global regularity for the netlist based on regularity, symmetry or dataflow. The method determines a group of elements having similar local regularity signatures within the netlist, applies a transform to the group of elements, and determines whether the local regularity signatures for each element are identical, removing changes to the netlist made by the transform if the signatures are different.

An element can include a net, a gate, or both a net and a gate. A local regularity signature includes a logic signature, a time signature, an area signature or a power signature, according to the method. The local regularity signature includes an adaptive signature for controlling changes in the netlist made by the transform. According to the method, a transform applies an action.

In yet another embodiment of the present invention, a method for maintaining regularity in a netlist during logic synthesis, includes calculating a regularity signature for each of a plurality of elements in the netlist. The method classifies elements into signature classes based on the regularity signatures. The method identifies a place in the netlist for applying a class method. The method also identifies the class method for the place in the netlist. Further, the method applies the class method to a class member. The method determines the success of the class method based on whether the method achieved a desired regularity signature for the class member. The method also updates the regularity signatures and signature classes after all class members have been visited. The method continues to identify places in the netlist.

According to the method, the class method is a transform which is applied to each class member thereby preserving regularity in the netlist and providing an improved final netlist.

The regularity signature can be a logic signature, a time signature, an area signature or a power signature. According to the method, the local regularity signature includes an adaptive signature for controlling changes in the netlist made by the transform.

The method identifies the class method by determining a method which achieves a favorable result in the netlist based on a delay signature, an area signature, a timing signature, a power signature or logic signatures.

The method determines the success of the class method based on whether the method achieved the favorable result by applying the class method to each class member if successful. The method undoes the class method if unsuccessful.

These and other objects, features, and advantages of the present invention will become apparent from the following detailed description of illustrative embodiments thereof, which is to be used in connection with the accompanying drawings.

BRIEF DESCRIPTION OF THE DRAWINGS

Preferred embodiments of the present invention will be described below in more detail with reference to the accompanying drawings.

DETAILED DESCRIPTION OF PREFERRED EMBODIMENT

Figure 2:
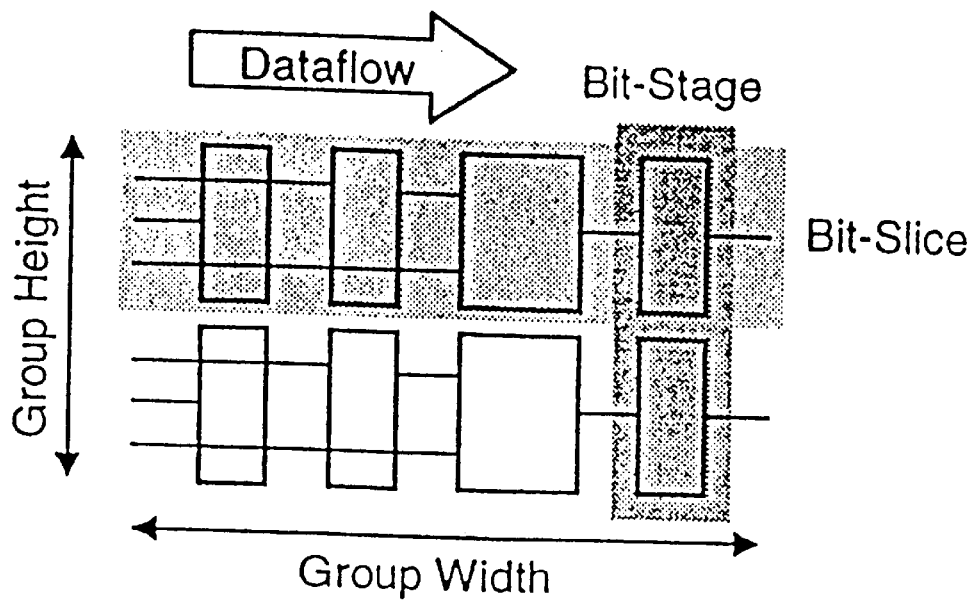
FIG. 2 is a schematic illustration of a regular group according to one embodiment of the present invention.

According to one embodiment of the present invention, a design is represented as a netlist comprising a set of gates G, a set of nets N and pins $P \subset G \times N$. The gates G, nets N and pins P are elements of a netlist. Furthermore, global regularity of a design refers to the assignment of elements of a netlist to regular groups. A regular group is a two-dimensional arrangement of identical or similar structures of elements, referred to as slices, as shown in FIG. 2. Further, a vertical entity of a regular group is called a stage.

The present invention utilizes drivers and transforms within the framework of an electronic design automation tool. A driver is a part of an algorithm which decides where and how to apply an action in a design or netlist. While a transform is a part of an algorithm, which applies the action, modifying the netlist. The driver iterates through the design, determines a beneficial sequence of transformations and selectively applies the transformations to a set of logic gates. This concept builds the base foundation for controlling the synthesis flow and applying actions dependent upon global design characteristics such as regularity, symmetry and dataflow.

For purposes of the present invention there are two primary groups of drivers, generic drivers and timing drivers, although other drivers may be employed. Generic drivers iterate through the design and apply a set of transformations to all gates or nets in the network. Generic drivers are mainly used during technology-independent optimization and technology mapping.

Alternatively, timing drivers use timing information of the design to improve cost functions. For example, critical delay, area or power consumption. In general, complicated delay rules reduce the ability of an algorithm to estimate the effect of changes to the network on the delay. Therefore, timing drivers apply a number of transformations, collect data including cost, and undo the transformations. Timing drivers are applied during technology dependent optimization such as delay and area reduction. Drivers apply different transformations in at least one place in the network before determining the most effective sequence of transformations and the place of application. In general, this trial and error sequence of applying transforms is computationally expensive.

The present invention is a method for maintaining the regularity of a defined characteristic of a netlist during logic synthesis, particularly, in electronic circuits. The invention uses a regularity signature to determine whether regularity is preserved during a logic transformation. In addition, a regularity signature is used to identify places with similar characteristics in the netlist to re-apply beneficial transformations and speed-up the logic synthesis. Designs can include electronic circuits, semiconductor chips and the like.

Figure 1:
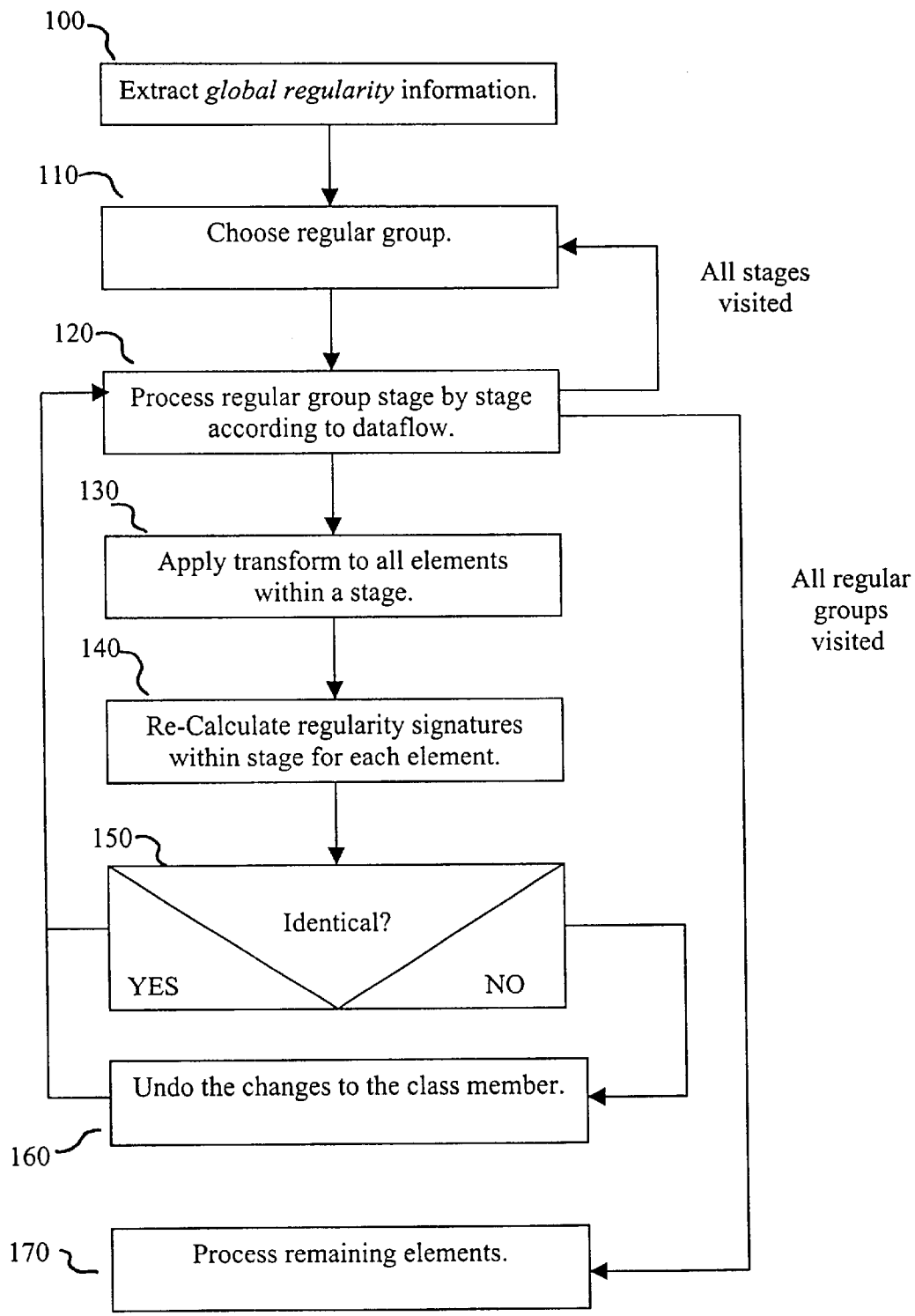
FIG. 1 is a block diagram showing according to one embodiment of the present invention.

The regularity signatures can be used in several methods. FIG. 1 illustrates a first method to preserve regularity which incorporates regularity signatures. The method determines a global regularity, 100, corresponding to the electronic circuit according to Kutzschebauch, T., *Logic Optimization Using Regularity Extraction*, In Proceedings of International Workshop On Logic Synthesis, June 1999., at 264–270. The method described by Kutzschebauch extracts regularity using AND/XOR representations of a netlist to allow high conformance of functional and structural equivalence. The method then extracts regular structures which can take any possible shape. According to the present invention, global regularity can be determined in accordance with the following relationship:

$$RI_p = \frac{1}{Aavg \cdot (n_{grp} + n_{nr})} \cdot \left( \sum_{i=1}^{n_{nr}} A_{nr_j} + \sum_{i=1}^{n_{grp}} \left( A_{grp_j} \cdot \frac{2 \cdot \sqrt{A_{grp_j}}}{h_i + w_i} \right) \right) - 1$$

$RI_p$ is the physical regularity index measuring the amount of global regularity that effectively improves area and delay cost functions in the final physical layout; $n_{grp}$ is the number of regular groups; $n_{nr}$ is the number of gates which are not assigned to a regular group; h is the group height; w is the group width; Aavg is the average physical area of a gate in the design; $Anr_i$ is the area of gate i not assigned to a regular group; and $Agrp_j$ is the area of the regular group, j.

Global regularity, as determined in accordance with the above relationship, determines which regular structures improve cost functions during the physical design process. Most modern very large-scale integration (VLSI) designs are characterized by a large amount of datapath circuitry to achieve performance through parallelisation and include a high degree of regularity. By identifying and maintaining structural regularity at an early design stage, it is possible to maintain the regularity throughout the technology independent optimization and technology mapping processes which tend to destroy regularity during conventional processes. For example, area and delay optimization criteria used during optimization steps are often inaccurate since no physical and structural design information is utilized. The actual layout of area and delay in a design can be significantly smaller since placement of regular structures in rows and columns yields a high packing density and short wiring distances. The use of structural regularity as an additional optimization criteria during logic synthesis improves and yields a more accurate prediction of the final physical layout of the design.

Taken as individual sections, the first section of the relationship measures the total number of objects in a design, applying the average area of a gate as normalization factor. This section can be written as the following relationship:

$$\frac{1}{Aavg \cdot (n_{grp} + n_{nr})}$$

The second section of the relationship represents the size of all non-regular objects, i.e., all gates not within a regular group, plus the area of all regular groups, multiplied by a factor that considers the shape of each regular group. The second section is written as:

$$\sum_{i=1}^{n_{nr}} A_{nr_j} + \sum_{i=1}^{n_{grp}} \left( A_{grp_j} \cdot \frac{2 \cdot \sqrt{A_{grp_j}}}{h_i + w_i} \right)$$

The second section of the relationship incorporates the concept of a regular group. FIG. 2 is an illustration of a regular group. The shape of a group, i.e., its height versus its width is an element effecting placement of the group. A group whose height versus its width is substantially disproportionate, is more difficult to place during physical layout since the group is more likely to become frozen at an early placement stage, often stuck in a non-optimal position.

The above description illustrates one example of a relationship incorporating a regular group. It would be obvious for one skilled in the art to apply a similar relationship to other groups having a different shape, for example, a rectangular group.

Figure 3:
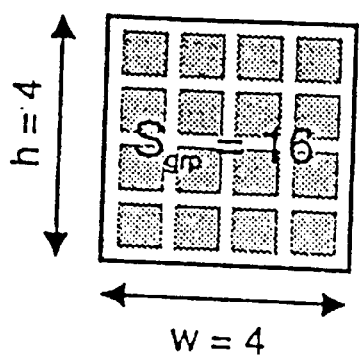
FIG. 3 is an illustration of a shape of a regular group according to one embodiment of the present invention.
Figure 4:
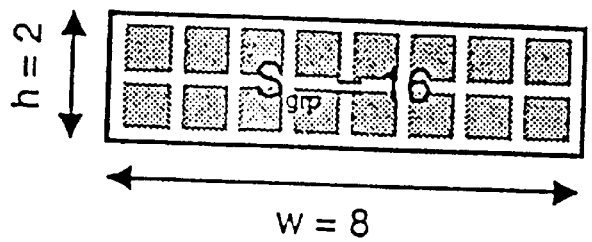
FIG. 4 is an illustration of a second shape of a regular group according to one embodiment of the present invention.

FIGS. 3 and 4 depict two regular groups of different shapes. FIG. 3 is a square group having four bit-stages and four bit-slices. While FIG. 4 is a rectangular group having two bit-slices and 8 bit-stages. The difference between the two groups can be determined by adding the width and height. FIG. 4 has a larger sum, ten, than FIG. 3, eight. A larger sum indicates that FIG. 4 is more difficult to place. At a given place, a group has a minimum boundary equal to two times the square root of the group's area. This relationship can be expressed as:

$$2 \cdot \sqrt{Agrp}$$

The higher the regularity index, the higher the estimated benefit is during the physical design phases. If the value of $RI_p$ equals 0, the electronic circuit has no usable regularity. In addition, the order of stages in a group follows the dataflow, as shown in FIGS. 1 and 2. The described structural regularity and dataflow information are utilized to drive the overall synthesis process, as will be described below.

Having determined global regularity, as used in the generic regularity driver, the method determines a regular group, 110.

In determining local regularity, the invention utilizes the concept of regularity signatures which serve the following purposes. One purpose is to speed up the synthesis process by applying transformations to places with similar characteristics. A second purpose is to observe and control local changes made by transformations during synthesis to maintain global regularity.

Figure 5:
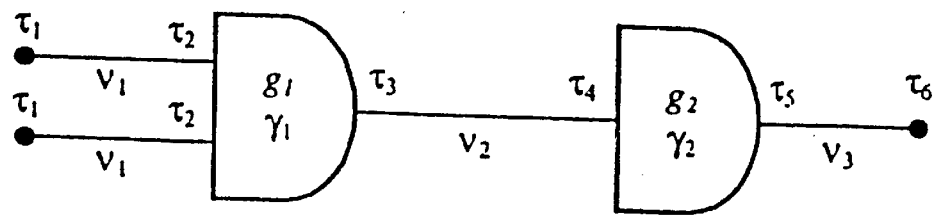
FIG. 5 is a diagram showing a relationship between gates, terminals and net types in accordance with the present invention.

Given a design D, including, for example, a set of gates G, a set of nets N and pins $P \subset G \times N$, each gate g of design D is associated with a gate type $\gamma$. It is defined by its logic function, area and/or power consumption, among others. As depicted in FIG. 5, each pin p of a gate g is characterized by a terminal type $\tau$ which is described by the function of p, e.g., input or output for simple combinatorial gates, or special functions for more complex or sequential gates, and additional characteristics such as the timing properties of pin p. A port, denoted by a solid circle in FIG. 5, is treated as a special pin that is not assigned to a gate. Consequently, we define a net type $\nu$ for each net n. A net type is characterized by timing, load and capacitance of n, among others.

The following definitions are set forth to aid in the description of the following section. Let $\gamma$, $\nu$ and $\tau$ be a gate, net and terminal type, respectively. A labeled directed graph LG=(V, E, Γ, M, Π) consists of a set V of vertices, a disjoint set E ⊂ V×V of edges, and mappings Γ of V to γ, M of E to ν, and Π of E to τ.

Figure 6:
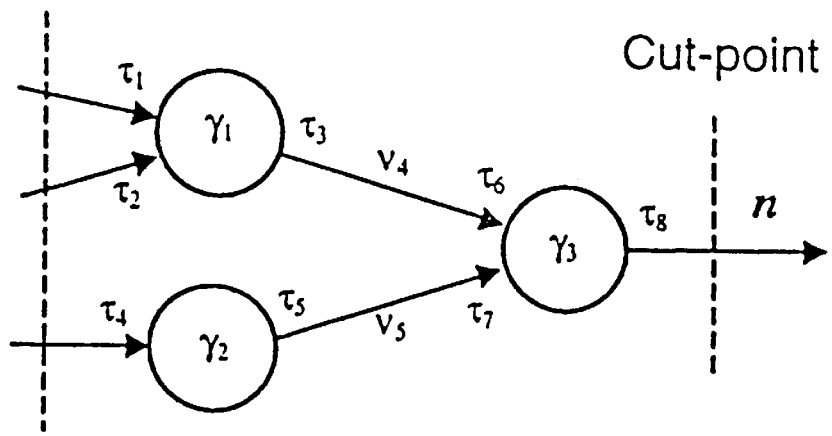
FIG. 6 is a diagram showing a regularity signature of a net in accordance with the present invention.

Referring to FIG. 6. A regularity signature RS of net n is defined as the labeled directed graph LG comprising the source vertex v, its immediate predecessors within the same regular group and associated edges. Hence, a regularity signature essentially represents the two logic levels which compute the value of net n. Regularity signatures are defined equivalent if their labeled directed graphs are identical.

A regularity signature considers the two preceding logic levels of a net to determine the effect of a logic transformation since many transforms employ two-level optimization. This definition can be extended to include n logic levels. This heuristic type of a regularity signature is particularly used to identify places with similar characteristics in the design in order to re-apply a beneficial transform.

The application of a regularity signature, among others, is to control and compare the changes made by a transformation to the network. Therefore, a more complex signature that includes all logic levels affected by a particular optimization algorithm, called an adaptive regularity signature, is defined. It is dependent on the particular transform T and is defined as follows:

Let $LG_0$ be the labeled directed graph of all elements assigned to regular groups in the original design, and $LG_1$ be the labeled directed graph after a transformation T, then an adaptive regularity signature $RS_a$ is defined as the symmetric difference of $LG_0$ and $LG_1$:

$$RS_a = LG_0 / LG_1 = (LG_0 - LG_1) \cup (LG_1 - LG_0).$$

Hence, an adaptive regularity signature is an exact measure of the effect of transform T on a particular design. An adaptive regularity signature is used to control changes in the netlist made by a transform to maintain regularity.

By including additional information into terminal, gate and net type, the method differentiates the following types of regularity signatures: logic, time, area and power signatures. Signature types are combined to satisfy the specific requirements and goals of the optimization process.

A logic signature represents the logic function $f$ of a regularity signature. The labeled directed graph representing a logic signature contains the logic function within gate type γ, and the pin function of a pin within terminal type τ.

In addition, a logic signature can be extended by information about the bit-stage of each gate to utilize the dataflow. The logic signatures associated with individual groups includes information about the bit-stage of each gate. Logic signatures are applied during technology dependent and independent transformations, they are the basic building blocks of every regularity signature.

Time, area and power signatures will be described in connection with an alternative embodiment of the present invention.

The method processes gates within regular groups, stage by stage, in the order of the dataflow 120, applying a transform simultaneously to all gates within a stage 130. The method calculates regularity signatures for all gates within a stage 140. The regularity signatures are compared with one-another 150 (the comparison is made between different gates during the same iteration), and if the signatures are not identical, the transform will be undone 160. The method will iterate through all stages in all regular groups. Thereafter, all remaining gates are processed 170.

Since the synthesis process identifies regularity at an early stage, applies transforms according to the dataflow simultaneously to gates within one stage and ensures that regularity signatures remain identical, it preserves more regular structures than a traditional synthesis process which applies transforms in an arbitrary order.

In an alternative embodiment of the present invention, regularity signatures are utilized in a timing regularity driver. Technology dependent optimization, such as delay or area reduction, is a computationally expensive process. Due to complex delay rules, transformations are repeatedly applied and undone utilizing a trial and error concept, until the most beneficial transformation and place for application has been determined. In general, this procedure yields high turn-around-times, particularly for VLSI designs.

Figure 7:
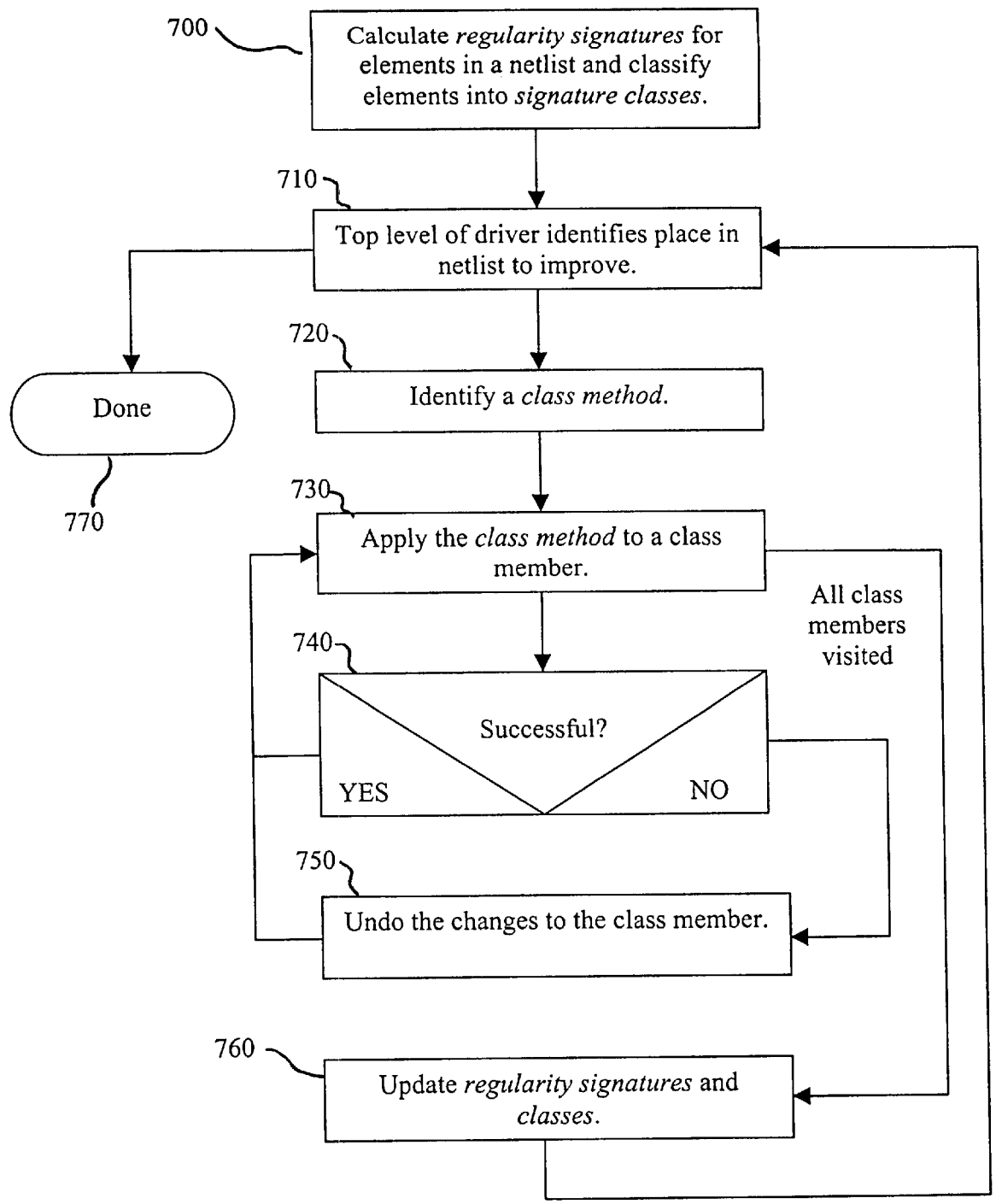
FIG. 7 is a block diagram according to another embodiment of the invention.

The present method illustrated in FIG. 7, utilizes regularity signatures to identify places with similar characteristics in the design. Further, the method selectively applies transformations. Regularity signatures, i.e., time-logic, power and area signatures are calculated for all nets in the design 700.

A time signature includes information about the arrival and required arrival times at the pins p of gates g. The arrival and required arrival time is assigned to each pin, and therefore modeled in the terminal type τ. In addition, time signatures may include other information, for example, the slew and load at the source and sink, respectively. Time signatures are equivalent by definition, if all their timing characteristics are within defined boundaries. Time signatures are normally applied during technology dependent optimization.

Similarly, an area signature is calculated by considering the area of all gates g in a substructure. Area signatures are considered equivalent, if the area of their gates g, modeled in the gate type γ, are within defined boundaries. Area signatures are normally applied during technology dependent optimization.

A power signature describes the power properties of a net n and is characterized by: the power consumption of gates g; the net capacitance of nets n; and the switching factor of nets n. Similarly to time and area signatures, power signatures are defined as equivalent, if all of their characteristics vary within a defined limit.

Each net is classified into a signature class according to its signature 700. The method determines the particular part of the design to process 710, e.g. a path to optimize delay, or area-reduction on another path. A sequence of transforms is applied to a place in the network, until a set of transforms which achieves a favorable or the best solution, called a class method, has been identified 720. The class method is applied to each class member 730. If the class method is unsuccessful with a class member, any changes in the network are undone 740. Success is a determination based on whether the method, applied as a transform, achieved a desired result, for example logic optimization including improvements in area-reduction, delay, run-time reduction, power consumption, and others. Thereafter, when all class members have been processed, the method updates the regularity signatures 760, and continues optimization on the next design part 710. This procedure continues until no improvements are possible, or a given optimization goal has been achieved 770.

For example, regularity driven optimization of the delay in the network would first identify 710 and optimize a critical path 720. A critical path is defined as a path through the netlist with the longest timing slack. Timing slack is defined in U.S. Pat. No. 5,508,937 (Incremental Timing Analysis), incorporated herein by reference, which describes a complete method to execute timing analysis on circuit designs. Assuming the critical path might be part of a data path, all other paths contained in the same datapath are members of the same class, and will be optimized using the same set of transformations 730–750.

Even though most transformations are characterized by local behavior, the method updates signatures 760 after each class has been processed due to timing, structural and other changes in the network.

The application of transformations to similar parts of the design speeds up the overall optimization process. In addition, since transformations are applied to all class members 730–750, regularity is widely preserved.

The presented synthesis methods can be extended by using a different kind of local regularity signature. The application of a regularity signature, controls and compares the changes made by a transformation in the network. Therefore, a more complex signature can include logic levels affected by a particular optimization algorithm, this is an example of an adaptive regularity signature. It is understood that one skilled in the art can develop other signatures for use with the present invention, and that the present invention is not limited to the preferred embodiments disclosed herein.

As a further extension, the usage of symmetry information, e.g., symmetric supergates known in the art, can be used to drive the synthesis process.

The proposed logic synthesis methods combine regularity information of the design with a driver-transform concept utilizing global design information to drive local transformations in the synthesis process. Regularity driven synthesis is able to speed up the synthesis process and/or improve synthesis quality while maintaining design regularity. Since the synthesis process identifies regularity at an early stage, applies transformations to bit-stages according to the dataflow and ensures that regularity signatures remain identical, regular structures are preserved. Due to the re-application of previously identified transforms to identical places in the network, more attention can be given to the careful selection of a good set of transforms to achieve higher optimization results. In addition, reuse of transforms yields a faster optimization process. A transform may be, for example, a buffer and inverter insertion, a fanout tree (re)-building, double inverter removal, pin swapping, breaking down complex circuit gates into simpler ones, and the like. Therefore, it is particularly suitable for the challenges imposed by the synthesis of very large designs. In addition, the preservation of regularity improves the final layout significantly.

Having described preferred embodiments of a method for designing electronic circuits, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claims and desired protected by Letters Patent is set for in the appended claims.

What is claimed is:

1. A method for maintaining regularity in a netlist during logic synthesis, comprising the steps of:

determining a global regularity for the netlist;

determining a group of elements in the netlist having regularity signatures of similar characteristics;

applying a transform to the group of elements while maintaining the global regularity during logic synthesis;

determining a regularity signature for each element with the group, wherein the regularity signature comprises an adaptive signature for controlling changes in the netlist made by the transform;

classifying each element within the group into a signature class according to the regularity signature;

identifying a place in the netlist to improve;

identifying a class method when an improvement can be made;

applying the class method to each member of the signature class;

determining whether the class method is successful;

upon determining that the class method is unsuccessful, removing the changes made by the class method; and updating regularity signatures and classes.

2. The method of claim 1, further comprising the steps of:

determining a regularity signature for each element within the group; and determining whether the regularity signatures for each element are identical; and removing changes to the netlist made by the transform, if the signatures are different.

3. The method of claim 1, wherein the method is performed for each stage in the order of dataflow through the netlist.

4. The method of claim 1, wherein the global regularity is determined in accordance with the following relationship:

$$RI_p = \frac{1}{Aavg \cdot (n_{grp} + n_{nr})} \cdot \left( \sum_{i=1}^{n_{nr}} A_{nr_i} + \sum_{i=1}^{n_{grp}} \left( A_{grp_j} \cdot \frac{2 \cdot \sqrt{A_{grp_j}}}{h_i + w_i} \right) \right) - 1$$

where:

$RI_p$ is the physical regularity index measuring the amount of global regularity that effectively improves area and delay cost functions in the final physical layout;

$n_{grp}$ is the number of regular groups;

$n_{nr}$ is the number of gates which are not assigned to a regular group;

h is the group height;

w is the group width;

Aavg is the average physical area of a gate in the design;

$Anr_i$ is the area of gate i not assigned to a regular group; and $Agrp_j$ is the area of the regular group, j.

5. The method of claim 1, wherein the step of identifying the class method further comprises the steps of:

applying a plurality of transforms to the place;

determining which transform achieves a defined solution; and defining the successful transform as the class method.

6. The method of claim 1, wherein the success of the class method is determined by whether the regularity signatures for each member of the signature class are identical after the application of the class method.

7. The method of claim 1, wherein each element within the group comprises one of a net, a gate, and both a net and a gate.

8. The method of claim 1, wherein the regularity signature comprises one of a logic signature, a time signature, an area signature and a power signature.

9. The method of claim 1, wherein the transform applies an action.

10. A method for maintaining regularity in a netlist during logic synthesis, comprising the steps of:

determining a global regularity for the netlist based on one of regularity, symmetry and dataflow;

determining a group of elements having local regularity signatures of similar characteristics within the netlist;

applying a transform to the group of elements, while maintaining the global regularity during the logic synthesis, wherein the local regularity signature comprises an adaptive signature for controlling the changes in the netlist made by the transform; and determining whether the local regularity signatures for each element are identical, removing changes to the netlist made by the transform if the signatures are different.

11. The method of claim 10, wherein each element within the group comprises one of a net, a gate, and both a net a gate.

12. The method of claim 10, wherein the local regularity signature comprises one of a logic signature, a time signature, an area signature and a power signature.

13. The method of claim 10, wherein the transform applies an action.

14. A method for maintaining regularity in a netlist during logic synthesis, comprising the steps of:

(a) calculating a regularity signature for each of a plurality of elements in the netlist, wherein the regularity signature comprises an adaptive signature for controlling the changes in the netlist made by a transform to a soup of elements;

(b) classifying the elements into signature classes based on the regularity signatures;

(c) identifying a place to be improved during the logic synthesis in the netlist;

(d) identifying a class method to be applied to the place in the netlist;

(e) applying the class method to each member of a selected signature class;

(f) determining whether the class method achieved a desired regularity signature for each member of the selected signature class; and (g) removing the changes made by the class method, if the class method does not achieve the desired regularity signature, thereby maintaining regularity in the netlist.

15. The method of claim 14, wherein the regularity signature is one of a logic signature, a time signature, an area signature and a power signature.

16. The method of claim 14, wherein the step of identifying the class method comprises the steps of applying a sequence of transforms to the place and determining a transform which achieves a favorable result in the netlist based on one of a delay signature, an area signature, a timing signature, a power signature and logic signatures, as the class method.

17. The method of claim 14, further comprising the steps of:

(i) applying the class method to each member of the selected signature class if the class method achieves the desired regularity signature;

(j) updating the regularity signatures and signature classes after all class members in the selected signature class have been visited by the class method; and (k) returning to step (c).

* * * * *